(12) United States Patent
Jang et al.

(10) Patent No.: US 7,129,747 B1
(45) Date of Patent: Oct. 31, 2006

(54) CPLD WITH FAST LOGIC SHARING BETWEEN FUNCTION BLOCKS

(75) Inventors: Tetse Jang, San Jose, CA (US); Soren T. Soe, San Jose, CA (US); Scott Te-Sheng Lien, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 90 days.

(21) Appl. No.: 10/966,268

(22) Filed: Oct. 15, 2004

(51) Int. Cl.
- *G06F 7/38* (2006.01)
- *H03K 19/173* (2006.01)
- *H03K 19/177* (2006.01)
- *H01L 25/00* (2006.01)

(52) U.S. Cl. .............................. 326/38; 326/37; 326/39; 326/40; 326/41; 326/47; 716/16

(58) Field of Classification Search ............ 326/37–41, 326/47; 716/16
See application file for complete search history.

(56) References Cited

U.S. PATENT DOCUMENTS

| | | | | |
|---|---|---|---|---|
| 5,450,021 A | * | 9/1995 | Chiang | 326/39 |
| 5,821,774 A | * | 10/1998 | Veytsman et al. | 326/39 |
| 5,963,048 A | * | 10/1999 | Harrison et al. | 326/39 |
| 5,969,539 A | * | 10/1999 | Veytsman et al. | 326/39 |
| 6,100,714 A | * | 8/2000 | Xiao et al. | 326/39 |
| 6,201,408 B1 | * | 3/2001 | Skahill et al. | 326/39 |
| 6,229,337 B1 | * | 5/2001 | Xiao et al. | 326/41 |
| 6,927,601 B1 | * | 8/2005 | Lin et al. | 326/41 |
| 2005/0144584 A1 | * | 6/2005 | Chen et al. | 716/16 |

OTHER PUBLICATIONS

Xilinx, Inc., CoolRunner-II CPLD Family, Preliminary Product Specification, DS090 (v2.1), Jul. 30, 2004, pp. 1-14, available from Xilin, Inc., 2100 Logic Drive, San Jose CA 95124.

* cited by examiner

*Primary Examiner*—Vibol Tan
*Assistant Examiner*—Dylan White
(74) *Attorney, Agent, or Firm*—Thomas A. Ward

(57) ABSTRACT

Fast logic sharing is created using a feedback path from the output logic macrocell of one functional block to the product term inputs of another function block without going through an advanced interconnect matrix (AIM). The fast feedback path may be provided from the macrocell after the product terms XOR gate without registering, and/or after the register in the macrocell. The fast logic sharing avoids the slow AIM for feedback logic, and allows additional resources to be borrowed from other function blocks with a limited delay penalty. In particular, delay penalties resulting from dividing wide operations requiring multiple product terms between the product terms of multiple functional blocks are significantly reduced.

18 Claims, 6 Drawing Sheets

CPLD WITH FAST LOGIC SHARING BETWEEN FUNCTION BLOCKS

TECHNICAL FIELD

The present invention relates to complex programmable logic devices (CPLDs). More particularly, the present invention relates to architecture of CPLDs, the CPLDs including logic function blocks interconnected by an advanced interconnect matrix (AIM), for interconnecting logic between function blocks interconnected by the AIM.

RELATED ART

FIG. 1 is a block diagram illustrating components of a typical CPLD. The typical CPLD architecture interconnects multiple function blocks 2 made up of components found on smaller sized PLDs using the AIM 4. Each function block 2 internally includes logic forming product term arrays 10, with outputs of the product term arrays 10 provided to macrocells (MC) 6. Outputs of the macrocells 6 are either provided through the AIM 4 to an output of function block 2 through an input/output (I/O) block 8, or on a feedback path through AIM 4 to the inputs of product term array 10 within the same functional block 2, or through the AIM 4 to inputs of the product term array 10 of a different functional block 2. An example of a CPLD is the CoolRunner™-II family of CPLDs available from Xilinx, Inc. of San Jose, Calif. FIG. 1 illustrates interconnections used on the CoolRunner™-II where sixteen connections to I/O blocks 8 are made from sixteen macrocells 6, sixteen outputs from the macrocells are also provided to the AIM 4, and forty terms are provided from the AIM 4 into each function block 2. Although specific numbers of interconnections are shown in FIG. 2, manufacturers use other numbers in different CPLD configurations provided. For a more detailed discussion of components of typical CPLDs, see "CoolRunner™-II CPLD Family, Preliminary Product Specification," DS090 (v2.1), Jul. 30, 2004, incorporated herein by reference in its entirety.

FIG. 2 shows more details of components included in a function block 2, including the product term array 10 as connected to a macrocell 6. Inputs to the product term array 10 include forty terms provided from the AIM. The input terms are provided on lines 11 as both true and complementary inputs with programmable interconnect points interconnecting the lines to form product term or Boolean logic AND functions 12. The product term outputs are then Boolean ORed using OR gate 14 in macrocell 6. For convenience, components carried over from FIG. 2 to FIG. 3 are similarly labeled, as will be components carried over in subsequent drawings.

The macrocell 6 as shown in FIG. 2 includes a Boolean XOR gate 16 that has a first input receiving the output of the OR gate 14, and a second input receiving an enable signal provided from a multiplexer 18. Multiplexer 18 is controlled by one of the product terms from the product term array 10. The output of the XOR gate 16 is provided in one path through a register 20 that can be configured to function as a D or T type flip-flop, a simple latch, or a dual edge latch, to a multiplexer 24. The output of the XOR gate 16 is provided on another path 26 bypassing the register 20 to a second input of multiplexer 24. The multiplexer 24 has control inputs programmed to select the signal from the register 20 or bypass path 26 to provide to an I/O block. Outputs from the register 20 and bypass path 26 of macrocell 6 are also illustrated in FIG. 2 as being provided on feedback lines to the AIM 4.

Common to all CPLD architectures is that sharing of resources between different function blocks incurs the delay of the AIM 4. FIG. 3 illustrates interconnection of the AIM 4 to multiple functional blocks $2_{1-3}$, each functional block $2_{1-3}$ having multiple macrocells with circuitry similar to FIG. 2. The AIM 4 is a highly interconnected low power rapid switch. Results from all function block macrocells circulate back through the AIM 4 for additional connection available to all other function blocks $2_{1-3}$ as dictated by design software. Some lines from the I/O blocks (not shown) are provided directly to the AIM 4 for distributing to the functional blocks. FIG. 3 illustrates the feedback paths provided from the macrocells to the AIM 4, as particularly illustrated by line 30, for redistribution through the AIM 4 to the same or different functional blocks. The feedback paths are from the output of macrocell register 20 and register bypass 26 to the AIM 4. The AIM 4, having a structure of the CoolRunner™-II, is shown providing forty inputs to the product term array 10 of each functional block, and the product term array 10 in turn provides fifty-six product term outputs that are distributed to OR gates 14 of the macrocells. Some CPLD architectures, e.g., the XC9500 from Xilinx, Inc. and the MAX5000 from Altera, Corp., allow for fast local feedbacks within the same function block, but still use the AIM for cross-function block sharing.

FIG. 4 is a simplified diagram illustrating delay provided through different components of the CPLD. Delay 31 from an input pin through the I/O block is labeled $T_{IN}$. Delay 33 through the product term array logic is labeled $T_{LOGI}$. The register 20 provides a delay 36 of $T_{SUI}$ that is the delay through the register setup before clocking, while delay 35 of $T_{COI}$ is the remaining delay through clocking. Delay 37 for the path bypassing the register 20 is labeled $T_{PDI}$. Delay 39 of a feedback path from the output of the register through the AIM back to the product term array is labeled $T_F$. Finally delay 40 labeled $T_{OUT}$ is the delay from the register through the I/O buffer to an output pin. Timing reports are created by tallying the incremental signal delays as signals progress within the CPLD. The timing reports illustrate a number of issues typically addressed with CPLDs designs as discussed to follow:

System frequency, a parameter for defining operation speed of the CPLD, can be determined using the incremental delays of the diagram shown in FIG. 4. The system frequency strongly depends on the number of logic levels, or times that a signal must proceed through the feedback path and product term array logic. Frequency is determined based on the delay between registers, $T_{CYC}$, as follows:

$$f_{SYSTEM} = 1/T_{CYC}$$

For a design with n logic levels, the system frequency may be determined as follows:

$$f_{SYSTEM} = 1/(T_{COI} + T_F + T_{LOGI} + (n-1)(T_F + T_{LOGI} + T_{PDI}) + T_{SUI})$$

II. Wide Inputs

Wide inputs required for an operation provide one example where multiple logic levels are needed. The signal containing very wide inputs, such as 45 inputs, cannot be placed in a system, such as illustrated in FIG. 1 which receives only 40 inputs at a time. For example, the software cannot place the following equation in the device:

$$o1 = a1 \text{ AND } a2 \text{ AND } a3 \text{ AND } a4 \text{ AND } \ldots \text{ AND } a45.$$

A general technique to solve the problem is to decompose the signal into two signals with smaller inputs and place the two signals in different function blocks. The result after decomposition may be:

o1=a1 AND a2 AND a3 . . . AND a25 AND n1;

n1=a26 AND a27 AND a28 . . . AND n44 AND a45.

The procedure incurs a delay penalty. The pin-to-pin delay, $T_{PD}$, after decomposition is $$T_{PD}=T_{IN}+T_{LOGI}+T_{PDI}+T_F+T_{LOGI}+T_{PDI}+T_{OUT}$$

The delay has been increased by $(T_F+T_{LOGI}+T_{PDI})$, thereby resulting in a reduction in overall system frequency.

In general, there is a tradeoff between maximizing system frequency (or operation speed) and minimizing operation density. In a minimal density mode, the goal is to reduce the number of macrocells and/or product terms used per level. The minimal density mode typically contains more logic levels, but fewer product terms performed at one time during an operation. In a speed mode or high frequency mode, the goal is to reduce the number of logic levels by fanning out the operation to use more product terms during a single operation. Thus in a speed mode, logic levels are collapsed down to a minimal number, and running a design at a higher speed may require using a larger PLD with more product terms operating in parallel.

III. Pin Locking

Pin locking, or an initial pin definition for the CPLD, is being defined earlier by CPLD users so that layout of a board containing other components in addition to the CPLD can progress in parallel. One of the advantages of the CPLD is the ability to make design changes without removing the device from the board. This advantage, however, requires that the architecture of the CPLD support maintaining the pinout of the device when internal logic is changed or reprogrammed.

After pin locking is established, when the CPLD programming software used by a customer assigns logic to I/O pins, the software is forced to place associated logic functions into specific macrocells and specific function blocks that are associated with each I/O pin. If the associated logic exceeds the available function block resources, such as macrocells, product terms, and the function block inputs, the software cannot map the logic to the macrocell.

A common method to address this problem of mapping a large amount of logic to CPLD components, such as a particular I/O pin, is logic buffering. The software separates the logic of the signal from the I/O pin by placing the I/O connection logic in the specific associated function block and placing the associated logic in one or more other function blocks. Logic buffering works, but incurs some penalties. In particular, the delay increases by $(T_F+T_{LOGI}+T_{PDI})$, because the signal path goes through one extra AIM path. This additional delay again reduces the maximum system frequency.

IV. Fittability

Multiple logic levels are desirable in a number of situations, including where logic buffering is needed to support pin locking as well as where increased operation speed is needed. For logic buffering used to fit a design to a specific CPLD, the desire for a speed mode as opposed to a minimal density mode makes it more difficult to keep pin locking. The desire for speed of operations may exist, even with multiple logic levels created to support wide operations. It would be desirable to provide a CPLD architecture to support increased operation speed even when multiple levels of logic are needed to fit functions into the available CPLD resources.

SUMMARY

In accordance with the present invention, the operational shortcomings of conventional CPLDs are addressed. In particular, delay penalties resulting from wide operations being divided between multiple logic levels are reduced. Placement of large logic equations can be distributed between multiple function blocks to better allocate resources with minimal added delay, as compared to conventional placement where some functional blocks process large equations while other functional blocks have an abundance of resources available.

Delays are reduced by providing fast logic sharing between function blocks of the CPLD. Fast logic sharing is created by a feedback path from the output logic macrocell of one function block to the product term inputs of another function block without going through the AIM. The fast feedback path can be provided from the macrocell after the product terms OR gate, and/or after the register of the macrocell. The fast logic sharing avoids the slow AIM for feedback logic, and allows additional resources to be borrowed from other function blocks with practically no delay penalty.

In particular, the feedback path from the output logic macrocell to a product term input of another functional block eliminates the delays through the AIM. Delay is further reduced with the feedback path bypassing both the AIM and macrocell register. Delay terms for the overall system operation frequency, $fS_{YSTEM}$, are eliminated showing an increased operation frequency relative to conventional CPLDs.

With a fast feedback path between functional blocks reducing delay, in accordance with the present invention, the following advantages occur: (1) overall operation frequency is increased with multiple logic levels; (2) large equations can be divided between logic levels with minimum delay; (3) pin locking can be provided with software using logic buffering to create multiple logic levels with minimal additional delay; and (4) device resource utilization is significantly improved, thus, avoiding the need for a larger CPLD.

BRIEF DESCRIPTION OF THE DRAWINGS

Further details of the present invention are explained with the help of the attached drawings in which.

DETAILED DESCRIPTION

Figure 5:
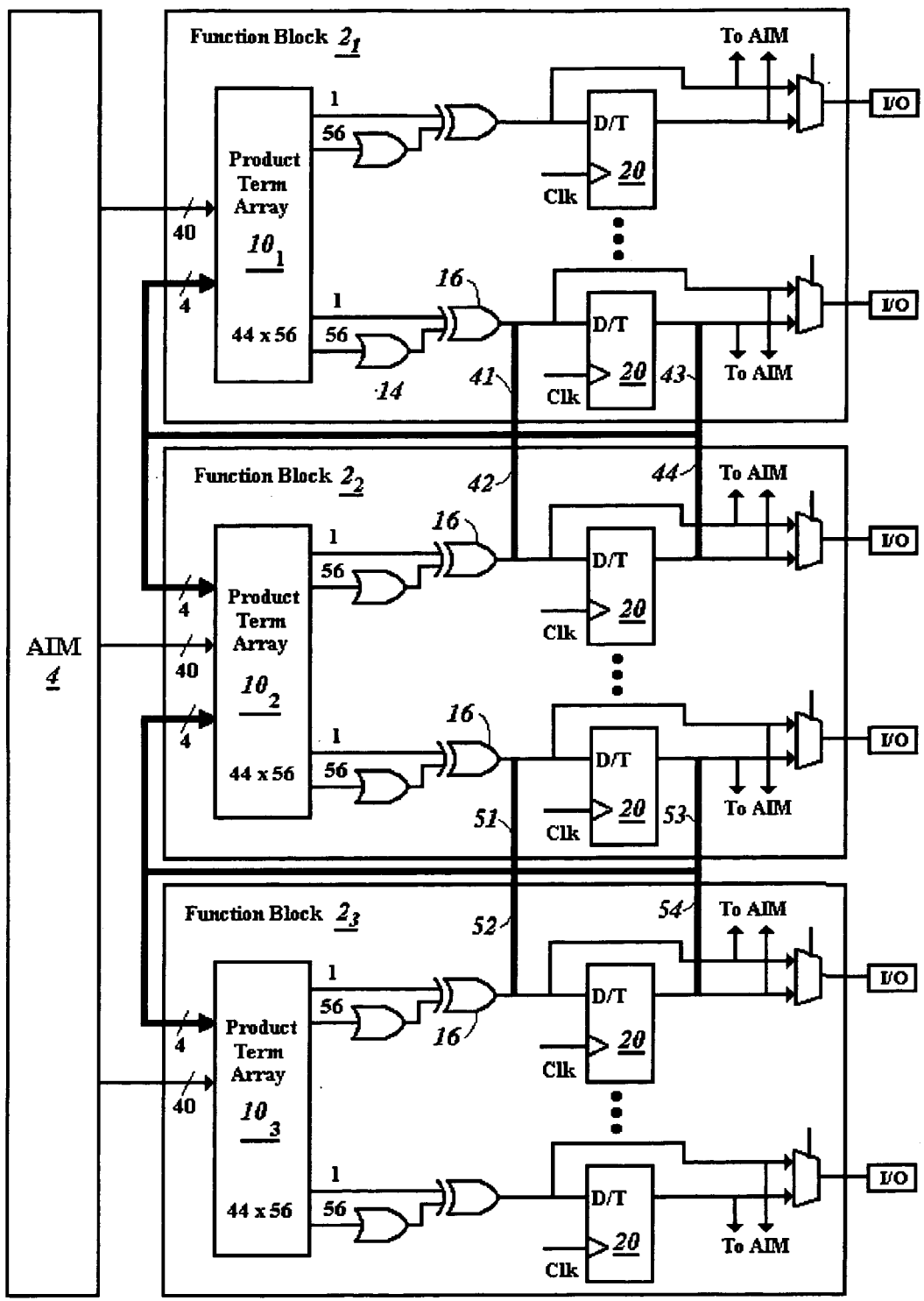
FIG. 5 illustrates the fast logic feedback paths between functional blocks of a CPLD provided in accordance with the present invention.

FIG. 5 illustrates the fast logic feedback paths 41–44 and 51–54 among functional blocks $2_{1-3}$ of a PLD provided in accordance with the present invention. The logic sharing is implemented by connecting shared generated logic directly to the input of the product term arrays in different function blocks $2_{1-3}$ using connections 41–44 and 51–54. In particular, the fast logic feedback paths bypass the AIM 4.

The shared connection feedback points may be from a number of different logic resources within a function block. For example the feedback point may be from the output of the XOR gate, such as XOR outputs 41 and 42, within a macrocell, or the output of the register, such register outputs 43 and 44, within a macrocell. The feedback may further be provided from both the output of the XOR gate 16 and the register 20. Although feedback connections after the XOR gate 16 and register 20 are illustrated, other connection points may likewise be used, such as after the OR gate 14, and in general, the feedback connection may be made from any internal node within a macrocell.

Figure 1:
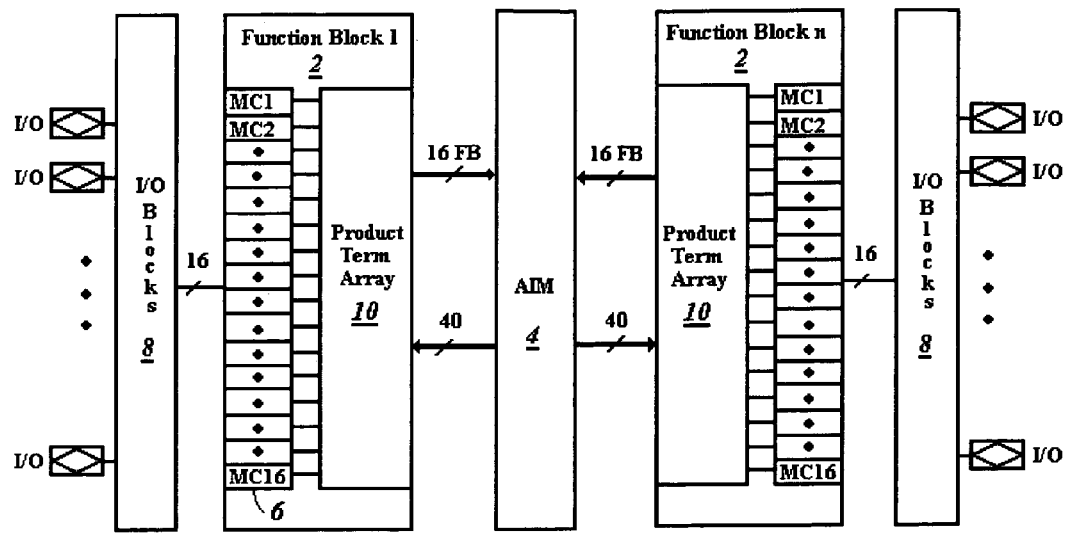
FIG. 1 is a block diagram of a conventional CPLD.
Figure 2:
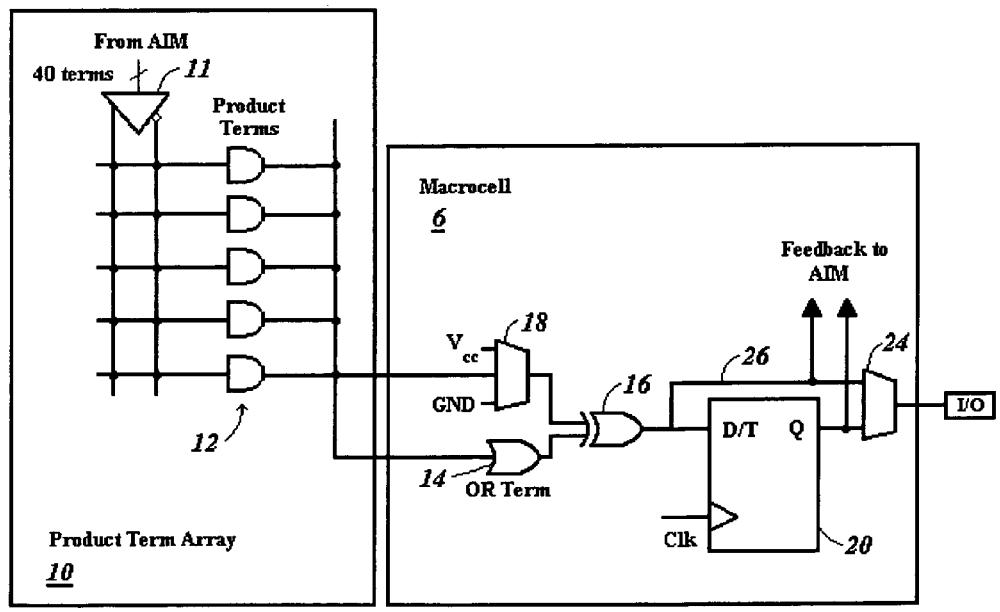
FIG. 2 shows details of circuitry of the product term array and an output logic macrocell for a function block for the CPLD of FIG. 1.
Figure 3:
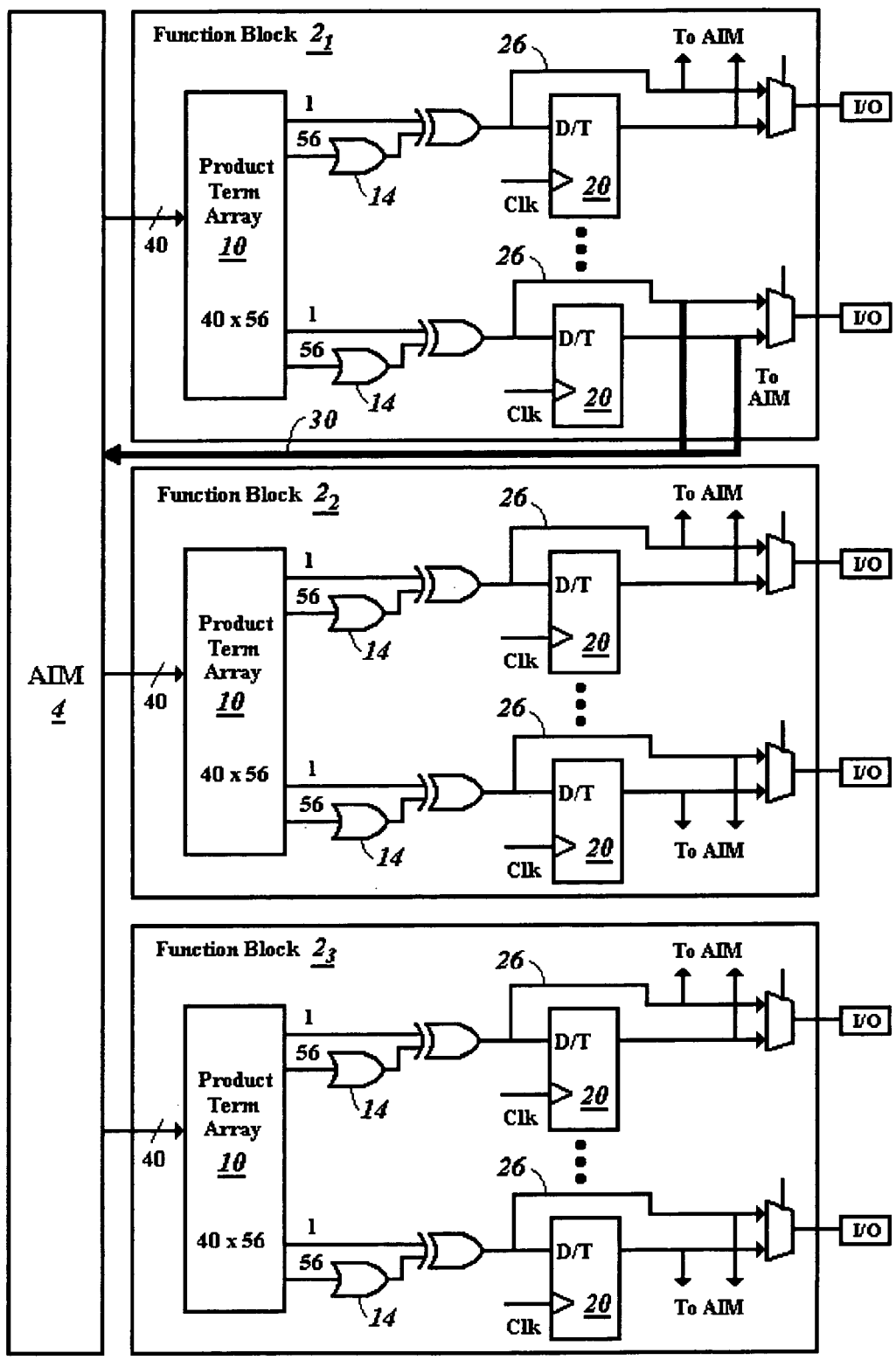
FIG. 3 shows details of circuitry of multiple function blocks as connected to an AIM for the CPLD of FIG. 1.
Figure 4:
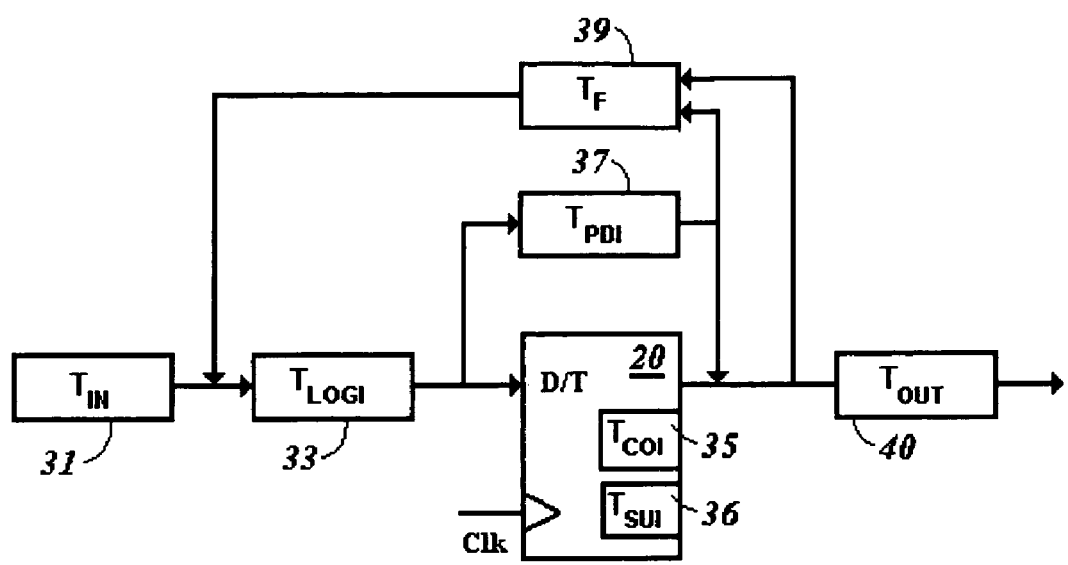
FIG. 4 is a diagram illustrating delay provided through different components of a CPLD.

The shared connection feedback points may further be shared among two or more functional blocks. The feedback paths shown include four connections 41–44 between neighboring function blocks 21 and 22, and four connections 51–54 between neighboring function blocks 22 and 23. The paths are provided from functional blocks $2_{1-3}$ to the inputs of product term arrays $10_{1-3}$. As illustrated, the product term arrays $10_{1-3}$ each have forty inputs from the AIM 4, similar to FIG. 3, along with four additional inputs from the fast feedback connections to make a 44×56 array. Each four input fast feedback includes two feedback signals from the same functional block and two from a neighboring functional block. Although logic sharing is shown between neighboring functional blocks, such as between blocks $2_1$ and $2_2$ or between blocks $2_2$ and $2_3$, sharing between other functional blocks combinations, such as between functional blocks $2_1$ and $2_3$, or from functional block $2_1$ to both functional blocks $2_2$ and $2_3$ may likewise be used. Similarly, although feedback is shown from components of one macrocell of a function block, fast logic sharing feedback may be provided from multiple macrocells. With the fast feedback connections 41–44 and 51–54 shown provided, thus, the inputs to product terms arrays $10_{1-3}$ each include forty inputs from the AIM 4, two fast feedbacks from same function block, and two fast feedbacks from different function blocks, although it is understood that different numbers of connections may be used depending on design requirements.

Figure 6:
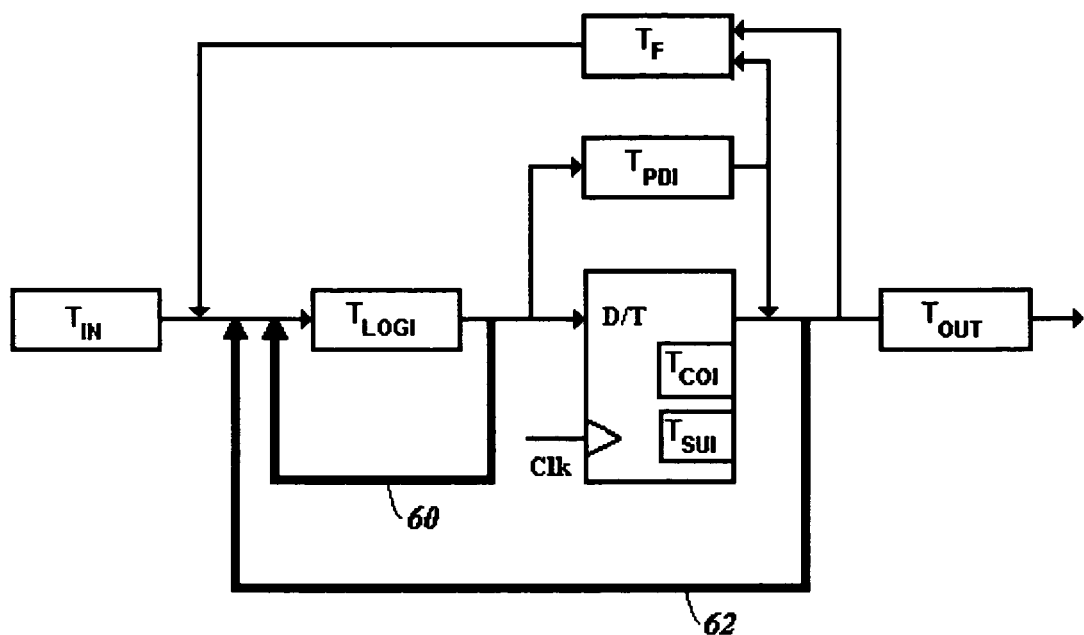
FIG. 6 is a diagram illustrating delay provided with fast logic feedback paths.

FIG. 6 is a diagram illustrating delay provided with fast logic feedback paths. A first feedback path 60 illustrates feedback from the XOR gate of the macrocell to a product term array input, while feedback path 62 illustrates a logic sharing feedback after the register 20 of the macrocell. The feedback path 60 provides a bypass of the delay $T_{PDI}$ and the delay $T_F$ through the AIM for combinational logic. The feedback path 62 provides a bypass of the delay $T_F$ through the AIM for a path through register 20.

The reduction in time delays as illustrated by FIG. 6, enables PLD design software to share operations between functional blocks while incurring only minimal delay and resource costs. For example the software may maximize operation frequency with the use of multiple logic levels. The software may also achieve very high pin locking ability with minimum delay. The software may further support wide fan-in logic with minimum delay cost. Additionally, a design may be more easily fitted to a small CPLD without resort to a larger device. Details of these advantages are described in the sections to follow.

I. Maximizing System Frequency

Figure 7:
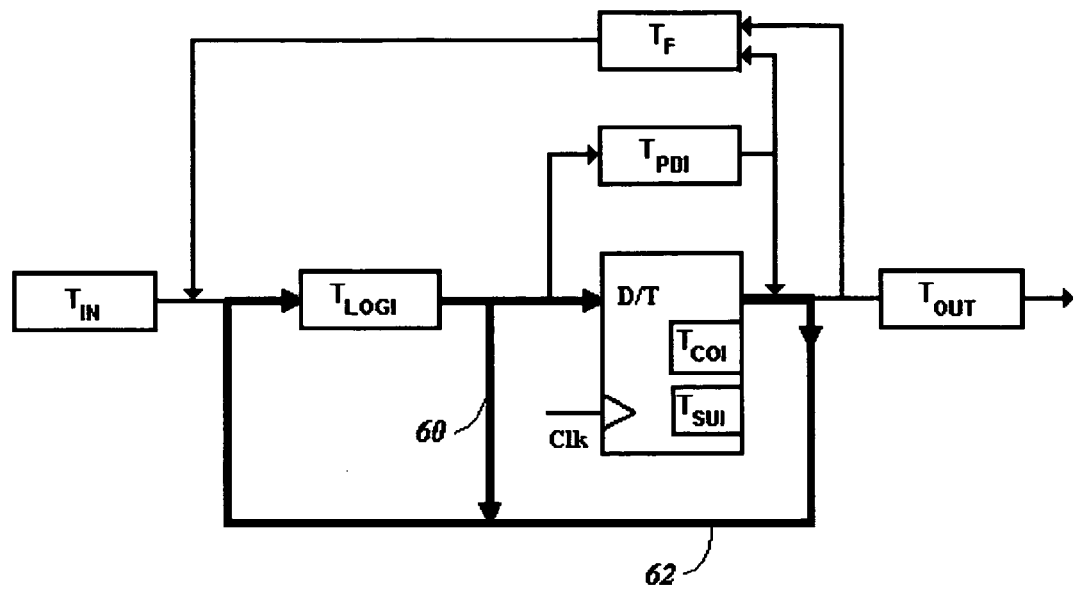
FIG. 7 is a diagram illustrating delay provided with a fast logic feedback path before and after the macrocell register to determine system frequency.

With fast logic sharing, the system frequency may be improved significantly. The system frequency for the new architecture with a diagram illustrated in FIG. 6. using the feedback path 60 from the XOR gate back as illustrated by the diagram of FIG. 7 is as follows:

One level: $f_{SYSTEM}=\min(1/(T_{COI}+T_{LOGI}+T_{SUI}), f_{TOGGLE})$

N levels: $f_{SYSTEM}=1/(T_{COI}+T_{LOGI}+(n-1)(T_{LOGI})+T_{SUI})$

Figure 8:
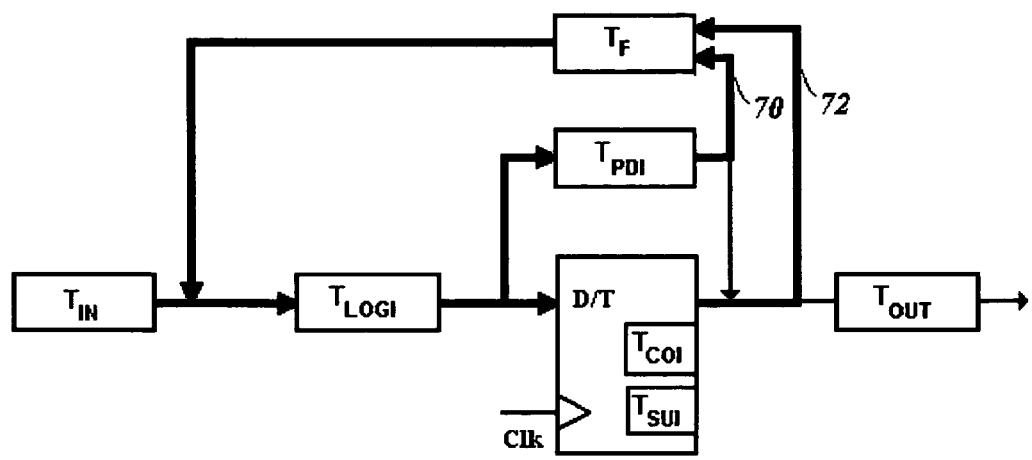
FIG. 8 is a diagram illustrating delay with feedback provided by a conventional system bypassing registering, but not using fast logic feedback path as in FIG. 7.

The system frequency for conventional CPLDs without fast logic sharing and feedback bypassing registering as illustrated by path 70 in FIG. 8 is as follows:

One level: $f_{SYSTEM}=\min(1/(T_{COI}+T_F+T_{LOGI}+T_{SUI}), f_{TOGGLE})$

N levels: $f_{SYSTEM}=1/(T_{COI}+T_F+T_{LOGI}+(n-1)(T_F+T_{LOGI}+T_{PDI})+T_{SUI})$ Note that both with and without the fast logic sharing, one path (62 for FIGS. 7 and 72 for FIG. 8) is provided through the register to the system output incurring the delay $T_{COI}$ and $T_{SUI}$. Without logic sharing during feedback, however, additional delays $T_F$ and $T_{PDI}$ are incurred. Thus, with logic sharing frequency is reduced by the delay of $T_F$ in the case of one logic level (or feedback only one time), and frequency is reduced by (n $T_F$+(n-1) $T_{PDI}$) for the case of multiple logic levels.

One important advantage of an architecture according to the present invention is the ability to maximize the system frequency. Typically, software optimizes the system frequency by collapsing critical nodes between registers to fanouts. The software repeats the process until none of the critical nodes can be collapsed due to device resource limitations, such as the number of product terms. With the invention, the system frequency may be improved dramatically by placing certain critical signals in the macrocells with fast logic sharing.

As an example, suppose a design is presented with three logic levels between registers. To optimize the system frequency, software tries to reduce the logic levels of the design from three levels to two levels. As mentioned above, the software achieves the goal by collapsing critical nodes to the fanouts. The process stops when all of the critical combinational nodes are non-collapsible. A node is non-collapsible if the product terms or inputs of the fanouts are wide enough to exceed device limitations after the collapsing. A typical result of the logic optimization is that most of the paths between registers have been reduced to two levels, but a few of them cannot be reduced from three. As a result, without fast logic sharing the system frequency is not improved at all, since the maximum system frequency is determined by the delay through the slowest path. Improved results may be obtained using fast logic sharing by assigning the few operations remaining at three levels between function blocks having the fast logic sharing feedback paths.

II. Support For Wide Input Signals

The shared logic architecture according to the present invention also makes it possible to implement wide-input signals with minimum delay penalty. Take the previous case for example with the following equation:

o1=a1 AND a2 AND a3 AND a4 AND . . . AND a45

The result after decomposition is:

o1=a1 AND a2 AND a3 AND a4 AND . . . AND a25 AND n1;

n1=a26 AND a27 AND a28 . . . AND a44 AND a45

With shared logic between functional blocks according to the present invention, the pin-to-pin delay after decomposition has been reduced from $$T_{PD}=T_{IN}+T_{LOGF}+T_{PDI}+T_F+T_{LOGI}+T_{PDI}+T_{OUT}$$

to $$T_{PD}=T_{IN}+T_{LOGI}+T_{LOGI}+T_{PDI}+T_{OUT}$$

Thus delay is reduced by the delay $T_F$ through the AIM and register bypass delay $T_{PDI}$.

III. Improved Pin Locking

By using fast logic sharing according to the present invention, it is further possible to fix pin locking at an early stage of a design with very low cost. As mentioned previously, a common skill to solve the problem of pin locking is called logic buffering. The logic buffering software separates the logic of the signal from the I/O pin by placing the I/O in the specific function block and placing the associated logic in another function block. According to the present invention, the delay associated with the resulting levels of logic is reduced. For a combinational signal that bypasses registering, the reduced delay for two levels is $T_F+T_{PDI}$, as indicated above. For a sequential signal using registering, the delay is reduced by $T_F$.

IV. Improved Fittability

Logic sharing according to the present invention makes it possible to fit a design to a smaller device while the system frequency remains almost the same as a speed mode where an entire operation is performed on one logic level. Take the example where a whole design may be reduced to two logic levels, resulting in a high cost because the total number of product terms on one level needed may have increased dramatically. The resulting design is likely to need fitting to a larger CPLD. With logic sharing according to the present invention, the logic optimizer will not collapse the nodes to the fanouts when the cost, the number of product terms being increased, is too high. The fitter will place one logic level "n2" to a macrocell with a fast logic sharing path. As a result, the total number of product terms required is reduced and the system frequency is almost the same as speed mode. The design is, thus, easier to fit and has more chance to be fit to a smaller device.

Although the present invention has been described above with particularity, this was merely to teach one of ordinary skill in the art how to make and use the invention. Many additional modifications will fall within the scope of the invention, as that scope is defined by the following claims.

What is claimed is:

1. A programmable logic device (PLD) comprising:
function blocks comprising product term arrays having outputs provided to macrocells;
an interconnect matrix interconnecting the macrocells of the function blocks to inputs of the product term arrays of the function blocks; and
a fast logic sharing connection that bypasses the interconnect matrix for connecting a given one of the macrocells in a first one of the function blocks to an input of a product term array in a second one of the function blocks.

2. The PLD of claim 1, wherein the fast logic sharing connection is provided from an internal node in the given macrocell.

3. The PLD of claim 1, wherein the fast logic sharing connection is provided from an output of an OR gate in the given macrocell.

4. The PLD of claim 1, wherein the fast logic sharing connection is provided from an output of a register in the given macrocell.

5. The PLD of claim 1, wherein the fast logic sharing connection is provided from an output of an XOR gate in the given macrocell.

6. The PLD of claim 5, wherein the XOR gate has a first input providing a Boolean OR of a number of product term outputs from the product term array of the first function block.

7. The PLD of claim 5, wherein the given macrocell comprises a register and a bypass path for bypassing the register and connecting to the interconnect matrix; and
wherein the fast logic sharing connection bypasses the bypass path.

8. The PLD of claim 1 fast logic sharing connection further connects the given macrocell in the first function block to an input of a product term array in the first function block.

9. The PLD of claim 1, wherein the first and second function blocks are adjacent one another.

10. A programmable logic device (PLD) comprising:
function blocks comprising product term arrays having outputs provided to macrocells;
an interconnect matrix interconnecting the macrocells of the function blocks to inputs of the product term arrays of the function blocks; and
fast logic sharing connections for interconnecting the macrocells and inputs of product term arrays of adjacent function blocks.

11. The PLD of claim 10, wherein the fast logic sharing connections in the macrocells are provided after a product terms OR gate.

12. The PLD of claim 10, wherein the fast logic sharing connections in the macrocells are provided after a register.

13. The PLD of claim 10, wherein the fast logic sharing connections are not provided through the interconnect matrix.

14. A method of programming a PLD including a plurality of function blocks and an interconnect matrix to perform an operation comprising:
providing at least one product term array input of a first function block directly from a macrocell of a second function block over a fast logic sharing path without going through the interconnect matrix.

15. The method of claim 14 further comprising the steps of:
determining when an operation is too large to be performed using all the product terms of one of the function blocks in one operation level;

dividing the operation determined to be too large for the product terms into multiple levels; and assigning the multiple levels to function blocks interconnected by the fast logic sharing path.

16. The method of claim 14 further comprising the steps of:

dividing an operation having multiple parts so that each part of the operation has multiple levels so that no level is too large to be performed using all the product terms of one of the function blocks, wherein the multiple parts have different number of levels; and dividing at least one of the multiple parts having the highest number of levels to be performed by function blocks interconnected by the fast logic sharing path.

17. A processor readable medium storing code for programming a PLD to perform an operation, the code when executed for programming the step of claim 14.

18. A programmable logic device (PLD) comprising:

function blocks comprising product term arrays having outputs provided to macrocells;

an interconnect matrix interconnecting the macrocells of the function blocks to inputs of the product term arrays of the function blocks; and means for interconnecting the macrocells and inputs of product term arrays of adjacent ones of the function blocks that bypasses the interconnect matrix.

\* \* \* \* \*